(12) United States Patent
Song et al.

(10) Patent No.: US 10,164,214 B2
(45) Date of Patent: Dec. 25, 2018

(54) DISPLAY PANEL HAVING ORGANIC BUFFER LAYER INCLUDING DROPLET MICRO-STRUCTURES FOR DECENTRALIZING STRESS AND METHOD FOR MANUFACTURING THE SAME

(71) Applicant: BOE Technology Group Co., Ltd., Beijing (CN)

(72) Inventors: Ping Song, Beijing (CN); Feifei Wang, Beijing (CN); Youwei Wang, Beijing (CN); Peng Cai, Beijing (CN); Jian Min, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/714,081

(22) Filed: Sep. 25, 2017

(65) Prior Publication Data

US 2018/0090712 A1 Mar. 29, 2018

(30) Foreign Application Priority Data

Sep. 26, 2016 (CN) .......................... 2016 1 0851854

(51) Int. Cl.
*H01L 29/08* (2006.01)
*H01L 51/52* (2006.01)
(Continued)

(52) U.S. Cl.
CPC ...... *H01L 51/5253* (2013.01); *H01L 27/3244* (2013.01); *H01L 51/0003* (2013.01);
(Continued)

(58) Field of Classification Search
CPC . H01L 51/5253; H01L 51/56; H01L 51/0003; H01L 27/3244
See application file for complete search history.

(56) References Cited

U.S. PATENT DOCUMENTS

2003/0117066 A1   6/2003   Silvernail
2008/0272367 A1*  11/2008  Cok .................... H01L 51/5253
                                                       257/40
(Continued)

FOREIGN PATENT DOCUMENTS

CN   104269426 A   1/2015
CN   104576959 A   4/2015
(Continued)

OTHER PUBLICATIONS

English Translation of Chinese Office Action for corresponding Chinese Application No. 201610851854.X.

*Primary Examiner* — Matthew Gordon
(74) *Attorney, Agent, or Firm* — Arent Fox LLP

(57) ABSTRACT

The disclosure provides a display panel and a method for manufacturing the same. The display panel includes: an underlying substrate; thin film transistors, a light emission layer, a first inorganic moisture-blocking layer successively arranged on the underlying substrate; an organic buffer layer arranged on the first inorganic moisture-blocking layer, the organic buffer layer comprises: droplet micro-structures for decentralizing a stress on the organic buffer layer; a second inorganic moisture-blocking layer arranged on the organic buffer layer; and a blocking layer, and a glass cover plate successively arranged on the second inorganic moisture-blocking layer.

13 Claims, 3 Drawing Sheets

(51) Int. Cl.
*H01L 27/32* (2006.01)
*H01L 51/00* (2006.01)
*H01L 51/56* (2006.01)

(52) U.S. Cl.
CPC .......... *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 2011/0290551 A1* | 12/2011 | Lee | H01L 51/0096 174/520 |
| 2015/0102326 A1 | 4/2015 | An | |
| 2015/0340655 A1* | 11/2015 | Lee | H01L 51/525 257/40 |
| 2016/0254489 A1 | 9/2016 | Sun et al. | |
| 2017/0148822 A1 | 5/2017 | Hu | |

FOREIGN PATENT DOCUMENTS

| | | |
|---|---|---|
| CN | 104882565 A | 9/2015 |
| CN | 105355634 A | 2/2016 |
| CN | 105870355 A | 8/2016 |
| KR | 2013-0022649 A | 3/2013 |
| WO | 2006/087941 A1 | 8/2006 |
| WO | 2016/072406 A1 | 12/2016 |

\* cited by examiner

--Prior Art--

DISPLAY PANEL HAVING ORGANIC BUFFER LAYER INCLUDING DROPLET MICRO-STRUCTURES FOR DECENTRALIZING STRESS AND METHOD FOR MANUFACTURING THE SAME

CROSS-REFERENCES TO RELATED APPLICATIONS

This application claims priority to Chinese patent application No. 201610851854.X filed on Sep. 26, 2016, which is incorporated herein by reference in its entirety.

FIELD

The present disclosure relates to the field of display technologies, and particularly to a display panel and a method for manufacturing the same.

BACKGROUND

An Organic Light-Emitting Diode (OLED) is recognized as the most promising display element due to its self-luminescence, high luminance, high contrast, low operating voltage, possibility to constitute a flexible display, and other characteristics.

The stress on the stress-accepting face of the inorganic moisture-blocking layer in the flexible OLED being bent is so concentrated that the inorganic moisture-blocking layer tends to be broken due to the poor flexibility thereof, thus resulting in a new erosion channel of water molecules at the breakage that may cause the encapsulation structure including the plurality of thin films to fail to block moisture, which may shorten the service lifetime of the flexible OLED.

SUMMARY

In one aspect, some embodiments of the disclosure provide a display panel. The display panel includes: an underlying substrate; thin film transistors, a light emission layer, a first inorganic moisture-blocking layer successively arranged on the underlying substrate; an organic buffer layer arranged on the first inorganic moisture-blocking layer, the organic buffer layer comprises: droplet micro-structures for decentralizing a stress on the organic buffer layer; a second inorganic moisture-blocking layer arranged on the organic buffer layer; and a blocking layer, and a glass cover plate successively arranged on the second inorganic moisture-blocking layer.

In another aspect, some embodiments of the disclosure provide a method for manufacturing the display panel above. The method includes: forming the thin film transistors, the light emission layer, and the first inorganic moisture-blocking layer successively on the underlying substrate; forming the organic buffer layer on the first inorganic moisture-blocking layer, the organic buffer layer comprises the droplet micro-structures for decentralizing the stress on the organic buffer layer; forming the second inorganic moisture-blocking layer on the organic buffer layer; and forming the blocking layer and the glass cover plate successively on the second inorganic moisture-blocking layer.

DETAILED DESCRIPTION

In order to make the objects, features, and advantages above of the disclosure more apparent and readily understood, the disclosure will be described below in further details with reference to the drawings and the embodiments thereof. Apparently the embodiments to be described are only a part but not all of the embodiments of the disclosure. Based upon the embodiments here of the disclosure, all the other embodiments derived by those ordinarily skilled in the art without any inventive effort shall come into the scope of the disclosure.

Figure 1:
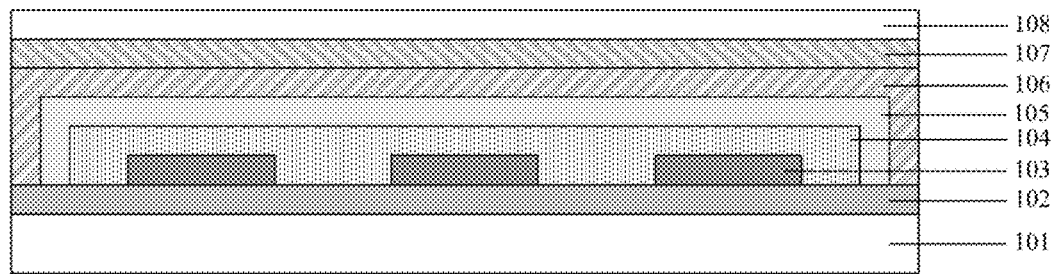
FIG. 1 is a schematic structural diagram of a display panel in the related art.

In some embodiments, referring to FIG. 1, a display panel includes: a flexible substrate 101, thin film transistors 102, a light emission layer 103, a first inorganic moisture-blocking layer 104, an organic buffer layer 105, a second inorganic moisture-blocking layer 106, a blocking layer 107, and a glass cover plate 108. In order to avoid the light emission layer 103 in the OLED device from being eroded by moisture and oxygen, a common practice is to encapsulate it using a hard substrate (e.g., made of glass) with a highly moisture-blocking. However this solution is not applicable to a flexible OLED device. The Thin Film Encapsulation is typically applicable to the flexible OLED device, that is, the flexible OLED is encapsulated using a plurality of thin film layers formed alternately by a plurality of inorganic moisture-blocking layers and organic buffer layers. The inorganic moisture-blocking layer 104 blocks moisture to some extent, but may not be well flexible; and the organic buffer layer is well flexible, but may not well block moisture. Accordingly the quality of flexible OLED encapsulated using the plurality of thin film layers may be restricted by the inorganic moisture-blocking layers.

Embodiments of the disclosure provide a display panel and a method for manufacturing the same so as to provide droplet micro-structures in an organic buffer layer to decentralize a stress on a stress-accepting face of an inorganic moisture-blocking layer being bent, to thereby alleviate such a problem that the stress on the stress-accepting face of the inorganic moisture-blocking layer is so concentrated that the inorganic moisture-blocking layer tends to be broken due to the poor flexibility thereof, thus resulting in a new erosion channel of water molecules at the breakage; and so as to provide the droplet micro-structures in the organic buffer layer to extend a path over which water molecules penetrate, to thereby lengthen a period of time for the water molecules to arrive at a light emission layer in the display panel, thus improving the service lifetime of the light emission layer. Both the moisture-blocking performance and the bending performance of the display panel according to the embodiment of the disclosure can be improved over the display panel in the FIG. 1, and the display panel can be simple in structure, and thus convenient to manufacture.

Figure 2:
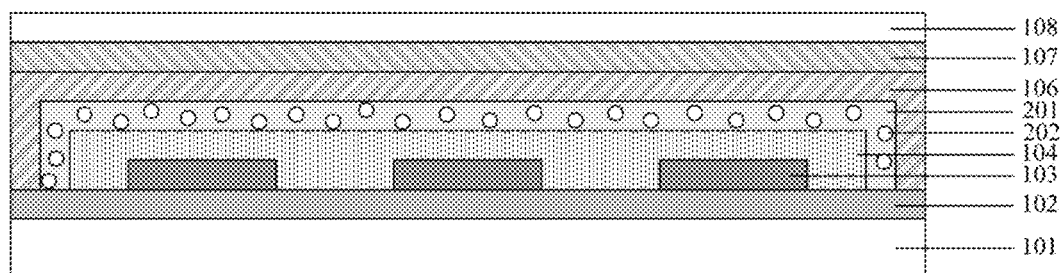
FIG. 2 is a schematic structural diagram of a display panel in accordance with an embodiment of the disclosure in a sectional view.

Referring to FIG. 2, an embodiment of the disclosure provides a display panel including: a first inorganic moisture-blocking layer 104, a second inorganic moisture-blocking layer 106, and an organic buffer layer 201 located between the first inorganic moisture-blocking layer and the second inorganic moisture-blocking layer, where the organic buffer layer includes droplet micro-structures 202 for decentralizing a stress on the organic buffer layer; and the droplet micro-structures 202 are distributed uniformly in the organic buffer layer.

The diameter of each of the droplet micro-structures 202 ranges from 0 micrometer to 16 micrometers and optionally from 0 micrometer to 15 micrometers.

Figure 3:
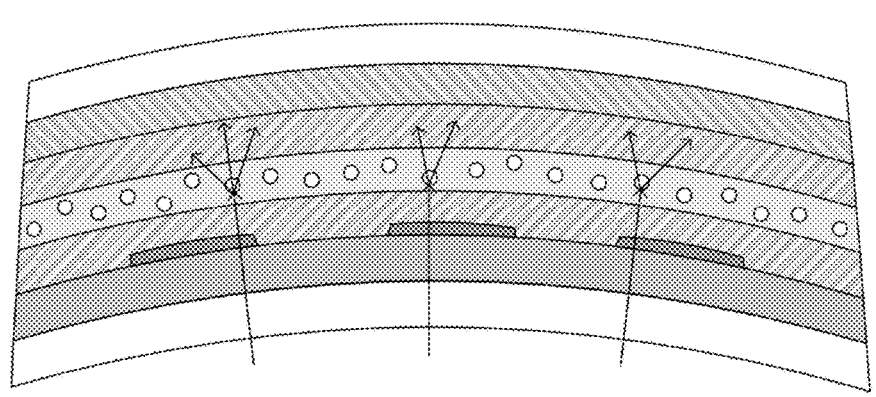
FIG. 3 is a schematic principle diagram of a display panel accepting a stress while being bent in accordance with an embodiment of the disclosure.
Figure 4:
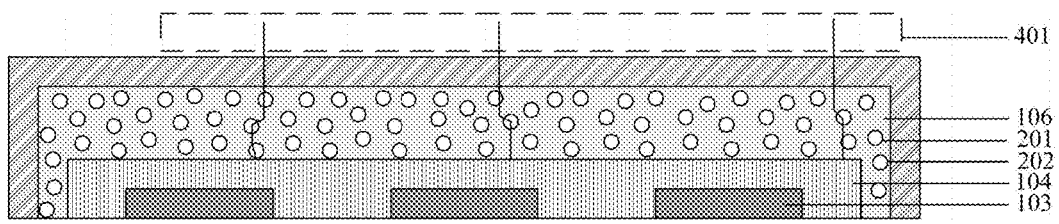
FIG. 4 is a schematic principle diagram of an inorganic moisture-blocking layer in a display panel in accordance with an embodiment of the disclosure.

In the embodiment of the disclosure, the droplet micro-structures are decentralized in the organic buffer layer to decentralize a stress on a stress-accepting face of the inorganic moisture-blocking layer being bent so as to alleviate the problem of the stress concentrated on the stress-accepting face of the inorganic moisture-blocking layer. Referring to FIG. 3, a stress-accepting point is transformed into a plurality of stress-accepting points due to the droplet micro-structures in the organic buffer layer to avoid the inorganic moisture-blocking layer from being broken due to the poor flexibility thereof, and thus a new erosion channel of water molecules at the breakage; and a path over which the water molecules penetrate is extended due to the droplet micro-structures in the organic buffer layer to thereby lengthen a period of time for the water molecules 401 to arrive at a light emission layer in the display panel, thus improving the service lifetime of the light emission layer, as illustrated in FIG. 4.

In some embodiments, the droplet micro-structures include a hygroscopic agent. Since the hygroscopic agent in the droplet micro-structures can absorb water molecules, the moisture-blocking performance of the organic buffer layer can be improved to thereby lower the possibility for the water molecules to reach the light emission layer in the display panel so as to improve the service lifetime of the light emission layer.

In some embodiments, the hygroscopic agent may be triglycol and/or glycerol.

Figure 5:
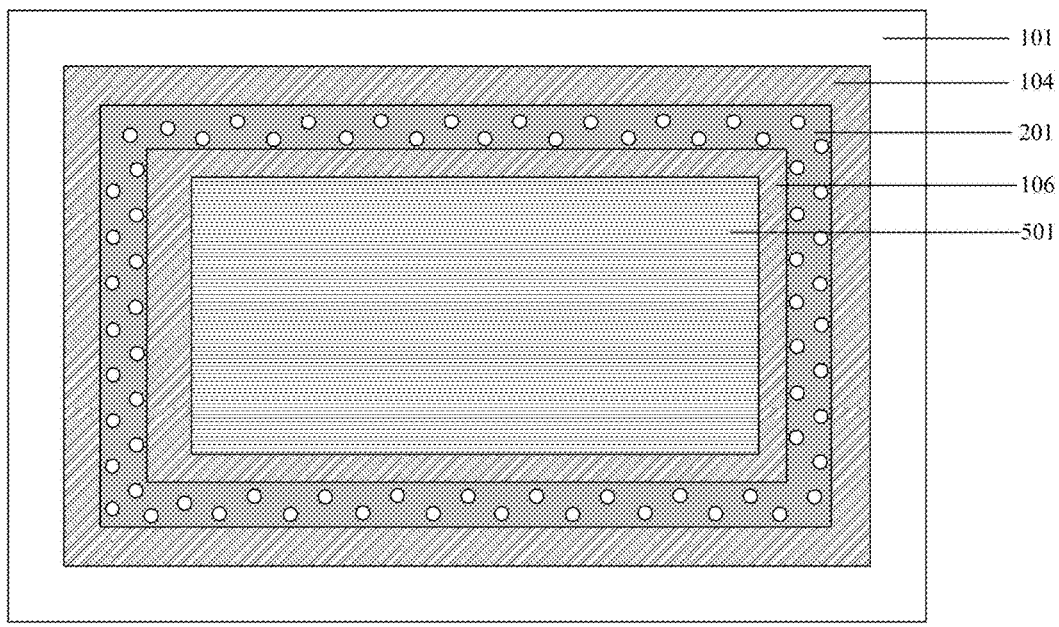
FIG. 5 is a schematic diagram of a display panel in accordance with an embodiment of the disclosure in a top view.

FIG. 5 illustrated the top view of the display panel in the some embodiments, the display panel further includes a display area 501.

Figure 6:
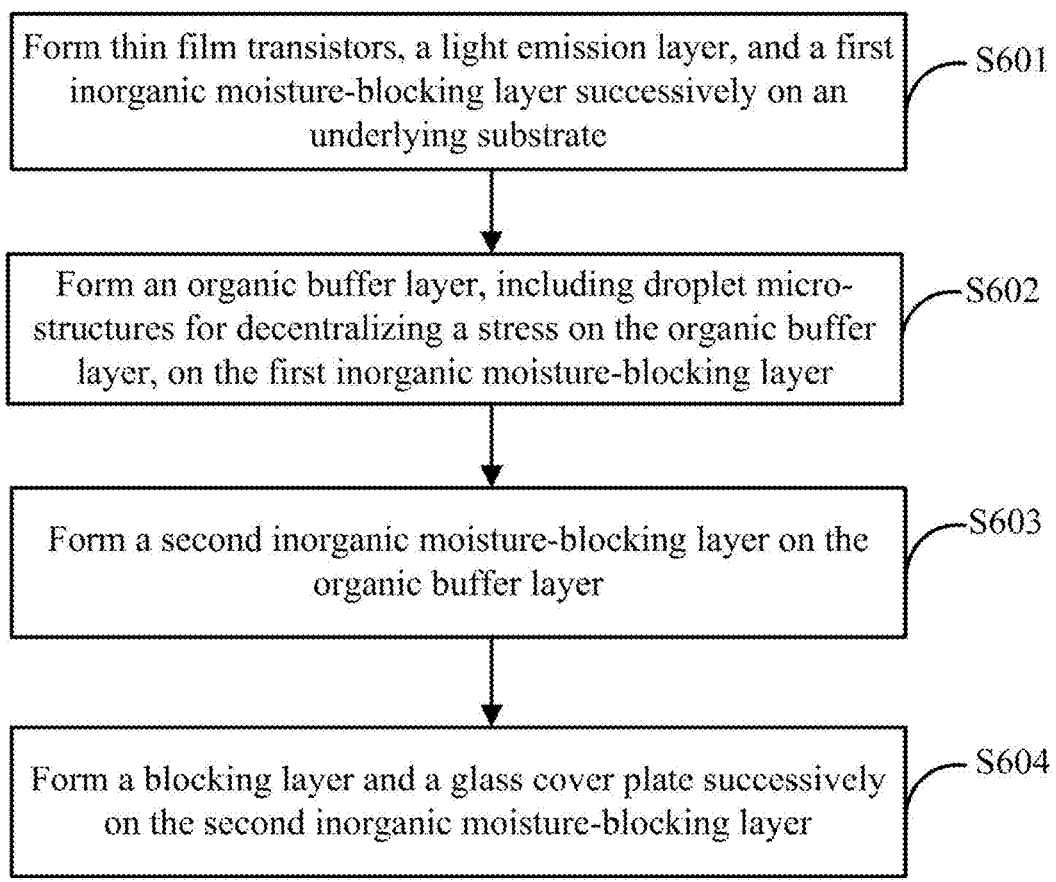
FIG. 6 is a schematic flow chart of a method for manufacturing a display panel in accordance with an embodiment of the disclosure.

Referring to FIG. 6, an embodiment of the disclosure provides a method for manufacturing a display panel, where the method includes:

S601 is to form thin film transistors, a light emission layer, and a first inorganic moisture-blocking layer successively on an underlying substrate;

S602 is to form an organic buffer layer, including droplet micro-structures for decentralizing a stress on the organic buffer layer, on the first inorganic moisture-blocking layer;

S603 is to form a second inorganic moisture-blocking layer on the organic buffer layer; and S604 is to form a blocking layer and a glass cover plate successively on the second inorganic moisture-blocking layer.

In some embodiments, the organic buffer layer, including the droplet micro-structures for decentralizing the stress on the organic buffer layer, is formed on the first inorganic moisture-blocking layer in the step S602 through polymerized phase-separation, solvent phase-separation, or temperature phase-separation.

In some embodiments, the step of forming the organic buffer layer, including the droplet micro-structures for decentralizing the stress on the organic buffer layer, on the first inorganic moisture-blocking layer through polymerized phase-separation includes:

The hygroscopic agent, a polymerizable monomer which can be activated under a preset condition to be polymerized, and a curing agent are mixed uniformly into a mixture, the mixture is coated on the first inorganic moisture-blocking layer through inkjet printing or spin-coating and the like, and the polymerizable monomer in the mixture is activated under the preset condition to be polymerized into the organic buffer layer including the droplet micro-structures, where the droplet micro-structures include the hygroscopic agent.

When the polymerizable monomer which can be activated under the preset condition to be polymerized is a light-polymerizable monomer, then the preset condition may be ultraviolet light irradiation; and when the polymerizable monomer which can be activated under the preset condition to be polymerized is a thermally polymerizable monomer, then the preset condition may be heating. The polymer and the hygroscopic agent are induced under the preset condition to be separated from each other so that the hygroscopic agent is decentralized in the organic buffer layer as the droplet micro-structures.

In some embodiments, the polymerizable monomer includes an acrylic ester or epoxy monomer.

In the embodiment of the disclosure, the hygroscopic agent, the light-polymerizable monomer or the thermally polymerizable monomer, and the curing agent are mixed, the mixture is coated on the first inorganic moisture-blocking layer, the polymerizable monomer is activated through light irradiation or heating to be polymerized, and the polymerizable monomer and the hygroscopic agent are induced to be separated from each other so that the hygroscopic agent are decentralized in the micro-structures in the organic buffer layer in the form of droplets to form the organic buffer layer, so as to decentralize the stress on the stress-accepting face of the moisture-blocking layer being bent, to thereby alleviate such a problem that the stress on the stress-accepting face of the moisture-blocking layer is so concentrated that the moisture-blocking layer tends to be broken due to the poor flexibility thereof, thus resulting in a new erosion channel of water molecules at the breakage.

In some embodiments, forming the organic buffer layer, including the droplet micro-structures for decentralizing a stress on the organic buffer layer, on the first inorganic moisture-blocking layer through solvent phase-separation includes:

The hygroscopic agent and a macromolecule polymer are solved in preset solvent into a mixture, the mixture is coated on the first inorganic moisture-blocking layer through inkjet printing or spin-coating, and the polymer and the hygroscopic agent are induced through heating to be extracted and separated from each other, so that the hygroscopic agent is decentralized in the organic buffer layer as the droplet micro-structures, thus forming the organic buffer layer including the droplet micro-structures, where the droplet micro-structures include the hygroscopic agent, and the preset solvent includes n-methyl-pyrrolidone (NMP).

In some embodiments, the macromolecule polymer includes poly-acrylic ester or epoxy resin or silicon resin (SiOC).

In the embodiment of the disclosure, the hygroscopic agent and the macromolecule polymer are solved in the preset solvent into the mixture solution, the mixture is coated on the first inorganic moisture-blocking layer, and the preset solvent is evaporated through heating to induce the macromolecule polymer and the hygroscopic agent to be extracted and separated from each other, so that the hygroscopic agent is decentralized in the micro-structures in the organic buffer layer in the form of droplets to form the organic buffer layer, so as to decentralize the stress on the stress-accepting face of the moisture-blocking layer being bent, to thereby alleviate such a problem that the stress on the stress-accepting face of the moisture-blocking layer is so concentrated that the moisture-blocking layer tends to be broken due to the poor flexibility thereof, thus resulting in a new erosion channel of water molecules at the breakage.

In some embodiments, forming the organic buffer layer, including the droplet micro-structures for decentralizing a stress on the organic buffer layer, on the first inorganic moisture-blocking layer through temperature phase-separation includes:

The hygroscopic agent and a macromolecule polymer are heated so that they are solved into each other to form a uniform mixture solution, the mixture solution is coated on the first inorganic moisture-blocking layer through inkjet printing or spin-coating and the like, and the polymer and the hygroscopic agent are induced through cooling to be separated from each other so that the hygroscopic agent is decentralized in the organic buffer layer as the droplet micro-structures, thus forming the organic buffer layer including the droplet micro-structures, where the droplet micro-structures include the hygroscopic agent.

In some embodiments, the macromolecule polymer includes poly-acrylic ester or epoxy resin or silicon resin (SiOC).

In the embodiment of the disclosure, the hygroscopic agent and the macromolecule polymer are solved into each other to form the mixture, the mixture is coated on the first inorganic moisture-blocking layer, and the macromolecule polymer and the hygroscopic agent are induced through cooling to be separated from each other, so that the hygroscopic agent are decentralized in the micro-structures in the organic buffer layer in the form of droplets to form the organic buffer layer, so as to decentralize the stress on the stress-accepting face of the moisture-blocking layer being bent, to thereby alleviate such a problem that the stress on the stress-accepting face of the moisture-blocking layer is so concentrated that the moisture-blocking layer tends to be broken due to the poor flexibility thereof, thus resulting in a new erosion channel of water molecules at the breakage.

In summary, the embodiments of the disclosure provide a display panel and a method for manufacturing the same so as to provide droplet micro-structures in an organic buffer layer to decentralize a stress on a stress-accepting face of an inorganic moisture-blocking layer being bent, to thereby alleviate such a problem that the stress on the stress-accepting face of the inorganic moisture-blocking layer is so concentrated that the inorganic moisture-blocking layer tends to be broken due to the poor flexibility thereof, thus resulting in a new erosion channel of water molecules at the breakage; and so as to provide the droplet micro-structures in the organic buffer layer to extend a path over which water molecules penetrate, to thereby lengthen a period of time for the water molecules to arrive at a light emission layer in the display panel, thus improving the service lifetime of the light emission layer. Both the moisture-blocking performance and the bending performance of the display panel according to the embodiment of the disclosure can be improved, and the display panel can be simple in structure, and thus convenient to manufacture. Since the hygroscopic agent in the droplet micro-structures can absorb water molecules, the moisture-blocking performance of the organic buffer layer can be improved to thereby lower the possibility for the water molecules to reach the light emission layer in the display panel so as to improve the service lifetime of the light emission layer.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A display panel, comprising:
    an underlying substrate;
    thin film transistors, a light emission layer, a first inorganic moisture-blocking layer successively arranged on the underlying substrate;
    an organic buffer layer arranged on the first inorganic moisture-blocking layer, the organic buffer layer comprises: droplet micro-structures for decentralizing a stress on the organic buffer layer;
    a second inorganic moisture-blocking layer arranged on the organic buffer layer; and
    a blocking layer, and a glass cover plate successively arranged on the second inorganic moisture-blocking layer;
    wherein the first inorganic moisture-blocking layer and the second inorganic moisture-blocking layer are isolated from each other by the organic buffer layer therebetween.

2. The display panel according to claim 1, wherein the droplet micro-structures comprise a hygroscopic agent.

3. The display panel according to claim 2, wherein the hygroscopic agent comprises triglycol and/or glycerol.

4. A method for manufacturing the display panel according to claim 1, the method comprising:
    forming the thin film transistors, the light emission layer, and the first inorganic moisture-blocking layer successively on the underlying substrate;
    forming the organic buffer layer on the first inorganic moisture-blocking layer, the organic buffer layer comprises the droplet micro-structures for decentralizing the stress on the organic buffer layer;
    forming the second inorganic moisture-blocking layer on the organic buffer layer; and
    forming the blocking layer and the glass cover plate successively on the second inorganic moisture-blocking layer.

5. The method according to claim 4, wherein forming the organic buffer layer comprising the droplet micro-structures for decentralizing the stress on the organic buffer layer comprises:
    forming the organic buffer layer comprising the droplet micro-structures for decentralizing the stress on the organic buffer layer through polymerized phase-separation, solvent phase-separation, or temperature phase-separation.

6. The method according to claim 5, wherein forming the organic buffer layer comprising the droplet micro-structures for decentralizing the stress on the organic buffer layer through polymerized phase-separation on the first inorganic moisture-blocking layer comprises:
    mixing a hygroscopic agent, a polymerizable monomer which can be activated under a preset condition to be polymerized, and a curing agent into a mixture;

coating the mixture on the first inorganic moisture-blocking layer, and activating the polymerizable monomer in the mixture under the preset condition to be polymerized into the organic buffer layer comprising the droplet micro-structures, wherein the droplet micro-structures comprise the hygroscopic agent.

7. The method according to claim 6, wherein the preset condition comprises ultraviolet light irradiation or heating.

8. The method according to claim 5, wherein forming the organic buffer layer comprising the droplet micro-structures for decentralizing the stress on the organic buffer layer through solvent phase-separation on the first inorganic moisture-blocking layer comprises:

solving a hygroscopic agent and a macromolecule polymer in preset solvent into a mixture; and coating the mixture on the first inorganic moisture-blocking layer, and forming the organic buffer layer comprising the droplet micro-structures through heating, wherein the droplet micro-structures comprise the hygroscopic agent.

9. The method according to claim 5, wherein forming the organic buffer layer comprising the droplet micro-structures for decentralizing the stress on the organic buffer layer through temperature phase-separation on the first inorganic moisture-blocking layer comprises:

solving a hygroscopic agent and a macromolecule polymer into each other to form a mixture; and coating the mixture on the first inorganic moisture-blocking layer, and forming the organic buffer layer comprising the droplet micro-structures through cooling, wherein the droplet micro-structures comprise the hygroscopic agent.

10. The method according to claim 6, wherein coating the mixture on the first inorganic moisture-blocking layer comprises: coating the mixture on the first inorganic moisture-blocking layer through spin-coating or inkjet printing.

11. The method according to claim 7, wherein coating the mixture on the first inorganic moisture-blocking layer comprises: coating the mixture on the first inorganic moisture-blocking layer through spin-coating or inkjet printing.

12. The method according to claim 8, wherein coating the mixture on the first inorganic moisture-blocking layer comprises: coating the mixture on the first inorganic moisture-blocking layer through spin-coating or inkjet printing.

13. The method according to claim 9, wherein coating the mixture on the first inorganic moisture-blocking layer comprises: coating the mixture on the first inorganic moisture-blocking layer through spin-coating or inkjet printing.

* * * * *